United States Patent
Rogers et al.

(10) Patent No.: US 7,976,748 B2
(45) Date of Patent: Jul. 12, 2011

(54) NANO-MOLDING PROCESS

(75) Inventors: John Rogers, Champaign, IL (US); Feng Hua, Potsdam, NY (US); Anne Shim, Billerica, MA (US)

(73) Assignees: The Board of Trustees of The University of Illinois, Urbana, IL (US); Dow Corning Corporation, Midland, MI (US)

( * ) Notice: Subject to any disclaimer, the term of this patent is extended or adjusted under 35 U.S.C. 154(b) by 431 days.

(21) Appl. No.: 12/065,769

(22) PCT Filed: Sep. 15, 2005

(86) PCT No.: PCT/US2005/032852
§ 371 (c)(1),
(2), (4) Date: Mar. 5, 2008

(87) PCT Pub. No.: WO2007/043987
PCT Pub. Date: Apr. 19, 2007

(65) Prior Publication Data
US 2008/0224358 A1  Sep. 18, 2008

(51) Int. Cl.
*B29C 33/40*  (2006.01)
*B29C 43/02*  (2006.01)
*B29C 43/58*  (2006.01)

(52) U.S. Cl. ........ 264/40.1; 264/225; 264/226; 264/319

(58) Field of Classification Search .............. 264/40.1, 264/225, 226, 293, 319, 320
See application file for complete search history.

(56) References Cited

U.S. PATENT DOCUMENTS

| | | | |
|---|---|---|---|
| 5,772,905 A | 6/1998 | Chou | |
| 2002/0150398 A1* | 10/2002 | Choi et al. | 396/428 |
| 2003/0071016 A1* | 4/2003 | Shih et al. | 216/54 |
| 2003/0089899 A1* | 5/2003 | Lieber et al. | 257/9 |
| 2004/0202249 A1 | 10/2004 | Lo et al. | |
| 2005/0079448 A1 | 4/2005 | Nakada et al. | |
| 2005/0100231 A1 | 5/2005 | Wang et al. | |
| 2005/0167370 A1 | 8/2005 | Nakajima et al. | |
| 2005/0254579 A1 | 11/2005 | Kondo | |
| 2006/0214326 A1* | 9/2006 | Kim et al. | 264/225 |
| 2006/0279025 A1* | 12/2006 | Heidari et al. | 264/320 X |

FOREIGN PATENT DOCUMENTS

| | | |
|---|---|---|
| JP | 2004340702 | 12/2004 |
| WO | 03031096 A2 | 4/2003 |
| WO | 03099536 A1 | 12/2003 |

OTHER PUBLICATIONS

Feng Hua, et al., Processing Dependent Behavior of Soft Imprint Lithography on the 1-10-nm Scale, IEEE Transactions of Nanotechnology, May 3, 2006, vol. 5, No. 3, pp. 301-308.
Japanese Office Action pertaining to Japanese Patent Appln. No. 2008531065, dated Dec. 14, 2010.

* cited by examiner

*Primary Examiner* — Leo B Tentoni
(74) *Attorney, Agent, or Firm* — Dinsmore & Shohl LLP

(57) ABSTRACT

A nano-molding process including an imprint process that replicates features sizes less than 7 nanometers. The nano-molding process produces a line edge roughness of the replicated features that is less than 2 nanometers. The nano-molding process including the steps of: a) forming a first substrate having nano-scale features formed thereon, b) casting at least one polymer against the substrate, c) curing the at least one polymer forming a mold, d) removing the mold from the first substrate, e) providing a second substrate having a molding material applied thereon, f) pressing the mold against the second substrate allowing the molding material to conform to a shape of the mold, g) curing the molding material, and h) removing the mold from the second substrate having the cured molding material revealing a replica of the first substrate.

17 Claims, 5 Drawing Sheets

NANO-MOLDING PROCESS

FIELD OF THE INVENTION

The invention relates to a process for nano-molding.

BACKGROUND OF THE INVENTION

New techniques for fabricating structures with nanometer dimensions are critically important to advances in nanoscience and technology. As the demand for smaller electronic devices, and biological analysis apparatus, has increased, a need has been created for improved fabrication processes for making such devices. The processes may be utilized in the fabrication of electronic, magnetic, mechanical, and optical devices, as well as devices for biological and chemical analysis. The processes may be used, for example, to define the features and configurations of microcircuits, as well as, the structure and operating features of optical waveguides and components.

These processes may also play a crucial role in the semiconductor industry, replacing conventional projection mode photolithography, whose practical limits make it impossible to reach resolution at sizes less than 45 nanometers. Projection mode photolithography is a method of patterning features, wherein a thin layer of photoresist is applied to a substrate surface and selected portions of the resist are exposed to a pattern of light. The resist is then developed to reveal a desired pattern of exposed substrate for further processing, such as etching. A difficulty with this process is that resolution is limited by the wavelength of the light, scattering in the resist and substrate, and the thickness and properties of the resist. As a result, projection mode photolithography cannot be utilized to economically create feature sizes less than 100 nanometers.

Next generation lithography (NGL) methods including e-beam, dip pen and nano-imprint techniques are being explored. E-beam methods include creating patterns in polymers, called resists, and using microlithography based on short wavelength UV radiation or electron beams. Patterns are formed due to a change in solubility of polymers from exposure to the imaging radiation with the use of a solvent to remove a portion of the polymer film. However, large scale commercially producing dimensions on a length-scale of less than 100 nm using these techniques is costly and can be carried out using very special imaging tools and materials.

Of the NGL techniques, those that use molds to imprint features into thin polymer films have attracted considerable attention. Although the well defined optics associated with photolithographic techniques allows their resolution to be specified accurately, the resolution limits of NGLs based on nano-molding are much more difficult to determine. The uncertain polymer physics that governs the molding process and the absence of a reliable means to evaluate the resolution at less than 5 nanometers in length represent some limits on current techniques.

There is therefore, a need in the art for a nano-molding process that solves the problems outlined above and can be utilized to produce relief structures that have lateral and vertical dimensions less than 10 nanometers. There is also a need in the art for such a process that allows for verification of dimensions on a part produced by the process.

SUMMARY OF THE INVENTION

A nano-molding process including an imprint process that replicates features sizes less than 7 nanometers. The nano-molding process produces a line edge roughness of the replicated features that is less than 2 nanometers. The nano-molding process including the steps of: a) forming a first substrate having nano-scale features formed thereon, b) casting at least one polymer against the substrate, c) curing the at least one polymer forming a mold, d) removing the mold from the first substrate, e) providing a second substrate having a molding material applied thereon, f) pressing the mold against the second substrate allowing the molding material to conform to a shape of the mold, g) curing the molding material, and h) removing the mold from the second substrate having the cured molding material revealing a replica of the first substrate.

DETAILED DESCRIPTION OF PREFERRED EMBODIMENTS

Figure 1A:
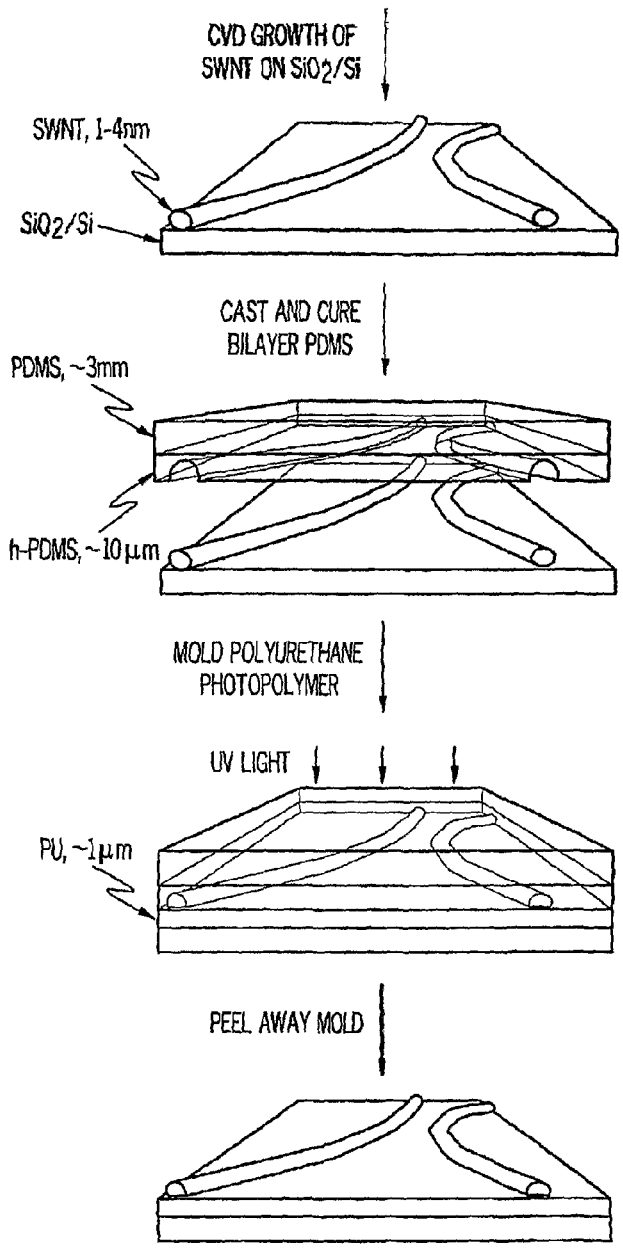
FIG. 1 (*a-c*) is a graphical representation of the process of nano-molding of the present invention.
Figure 1B:
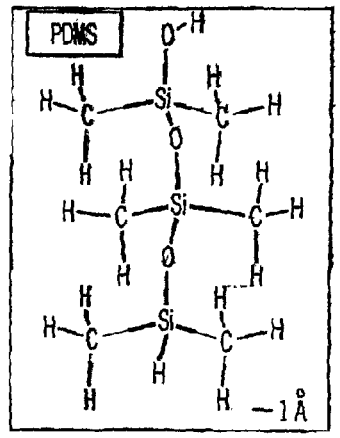
Figure 1C:
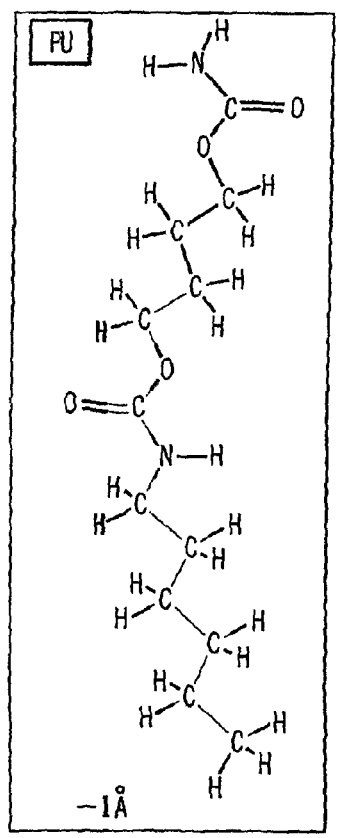
Figure 2A:
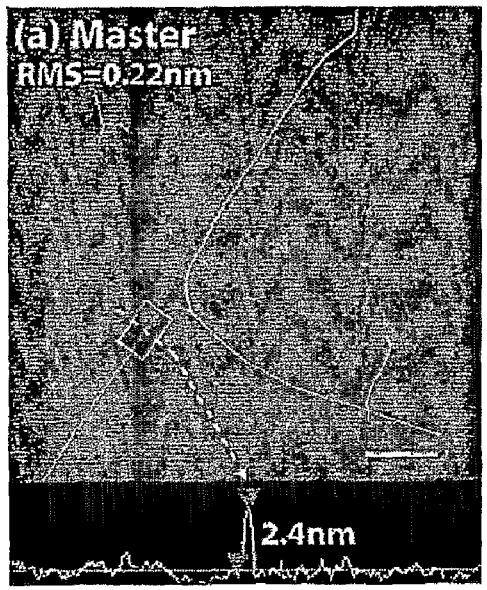
FIG. 2 (*a-d*) is an atomic force microscopy image of a single walled carbon tube of the first substrate (a) and three separate replicas produced by the process of the present invention (b-d)
Figure 2B:
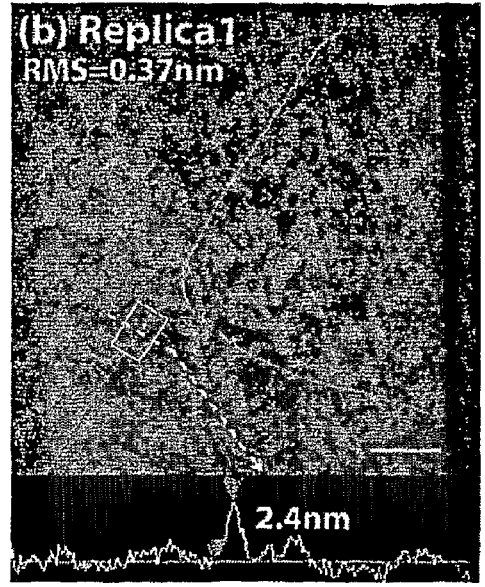
Figure 2C:
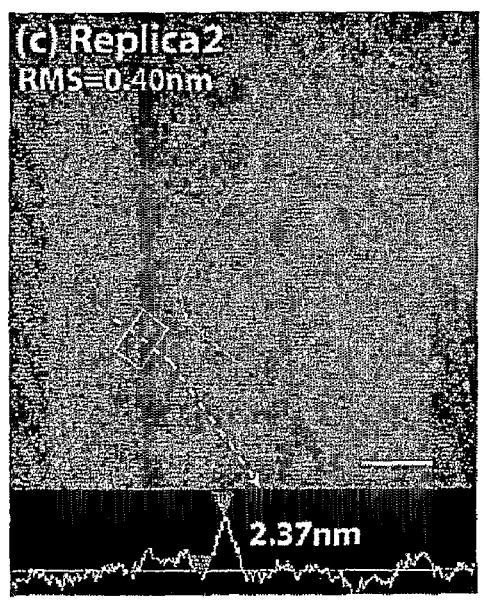
Figure 2D:
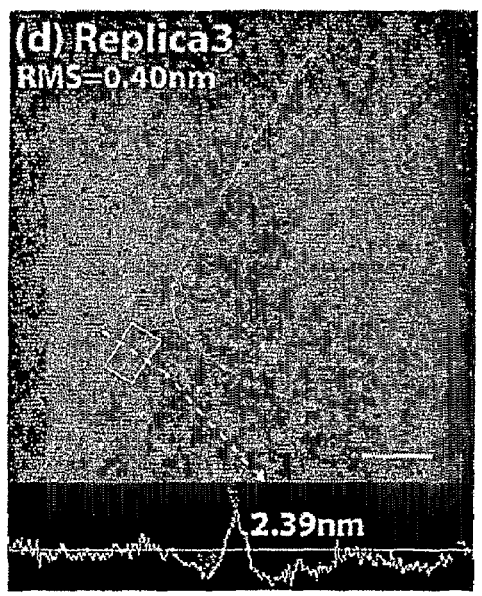

Referring to FIG. 1, there is shown a graphical representation of the nano-molding process of the present invention. The process includes the steps of: a) forming a first substrate having nano-scale features formed thereon, b) casting at least one polymer against the first substrate, c) curing the at least one polymer forming a mold, d) removing the mold from the first substrate, e) providing a second substrate having a molding material applied thereon, f) pressing the mold against the second substrate allowing the molding material to conform to a shape of the mold, g) curing the molding material, and h) removing the mold from the second substrate having the cured molding material revealing a replica of the first substrate.

In a preferred aspect of the invention, the first substrate is a silicon wafer having single walled carbon nanotubes (SWNT) formed thereon. The silicon wafer may include a layer of silicon dioxide ($SiO_2$) formed thereon to promote adhesion and formation of the SWNTs. The first substrate may also include other materials, such as, molds made with e-beam lithography, X-ray lithography, or a biological material on a plastic sheet. The first substrate preferably includes high quality sub-monolayers of small diameter SWNTs that serve as templates from which nanomolds can be constructed. The cylindrical cross sections and high aspect ratios of the tubes, the atomic scale uniformity of their dimensions over lengths of many microns, their chemical inertness and the ability to grow or deposit them in large quantities over large areas on a range of substrates makes the SWNTs suitable for use in the process of the present invention.

The SWNTs may be formed using methane based chemical vapor deposition using a relatively high concentration of ferritin catalysts. The SWNTs formed may have diameters of from 0.5 to 10 nm and preferably have diameters between 0.5 and 5 nm and a coverage of 1-10 tubes/m$^2$ on SiO$_2$/Si wafers. The continuous range of diameters of the tubes and their relatively high, but sub-monolayer, coverage make them ideal for evaluating resolution or dimension limits. The cylindrical geometry of the SWNTs allows their dimensions to be characterized simply by atomic force microscope (AFM) measurements of their heights. The SWNTs are bound to the SiO$_2$/Si wafers by van der Waals adhesion forces that bind the SWNTs to the substrate with sufficient strength to prevent their removal when a cured polymer mold is peeled away, as will be discussed in more detail below. Preferably the SWNTs have an absence of polymeric residue on large regions allowing for the replication of fine resolution features formed on the first substrate. The lack of polymeric residue indicates that the mold did not contaminate the master, thus the features in the mold are due to true replication and not material failure. Optionally, the SWNT formed on the first substrate may include a layer of a silane applied thereon, to act as a release agent, preventing adhesion of a polymer used to form a mold of the first substrate.

Following forming the first substrate, at least one polymer is cast and cured against the first substrate to form a mold. In a preferred aspect of the present invention, the mold is a composite mold having multiple polymer layers. The first layer applied against the first substrate is a relatively high modulus (~10 MPa) elastomer based on polydimethylsiloxane, (h-PDMS). The h-PDMS is preferably prepared by mixing vinylmethylsiloxane-dimethylsiloxane, 1,3,5,7-tetravinyl-1,3,5,7-tetramethylcyclotetrasiloxane, and a platinum catalyst. Next, methylhydrosiloxane-dimethylsiloxane is added and mixed forming a prepolymer mixture of h-PDMS. The prepolymer mixture of h-PDMS may be cast by spin casting or otherwise depositing the prepolymer mixture of h-PDMS on the first substrate. The prepolymer mixture of h-PDMS is partially cured by the platinum catalyst that induces addition of SiH bonds across vinyl groups in the prepolymer mixture of h-PDMS, forming SiCH$_2$—CH$_2$—Si linkages (also known as hydrosilylation). The multiple reaction sites on both the base and crosslinking oligomers in the prepolymer mixture of h-PDMS allows for 3D crosslinking prohibiting relative movement among bonded atoms. The low viscosity (~1000 cP at room temperature) of the prepolymer mixture of h-PDMS and the conformability of the silicone backbone allows for replication of fine features.

A second polymer is then applied to a back of the partially cured h-PDMS layer. Preferably, a physically tough, low modulus PDMS (s-PDMS) layer is applied to the partially cured h-PDMS layer to make the mold easy to handle. In a preferred aspect of the present invention the s-PDMS is Sylgard 184 commercially available from Dow Corning Corporation. After application of the s-PDMS layer, the multiple layers of polymer on the first substrate may be fully cured to form a composite mold.

Following formation of the mold, a molding material is applied to a second substrate to which the mold is pressed, allowing the molding material to conform to the shape of the mold. The second substrate preferably is a SiO$_2$/Si wafer, as previously described in relation to the first substrate. Other materials may also be utilized including wafers, plastic films, glass plates or other materials suitable for the purpose of acting as a substrate.

The molding material can be a prepolymer, monomer or any polymer capable of molding with the composite mold, and posses the necessary characteristics for analysis. Preferably the molding material is a polyurethane prepolymer (PU) and even more preferably a photo-curable or Ultraviolet curable PU polymer. Additionally, the molding material may be polyacrylic acid (PAA), which is capable of analysis by TEM imaging. The PU formulation preferably includes a prepolymer, a chain extender, a catalyst and an adhesion promoter. Lightly pressing the mold against this layer causes the liquid PU prepolymer to flow and conform to the relief features on the mold. Passing light through the transparent mold causes the PU to undergo chain extension and crosslinking to yield a set PU with Shore D hardness in the range of 60. Following curing of the molding material, the mold is removed to reveal a replica of the features formed on the first substrate.

Direct AFM characterization of the surface of the PU reveals, with atomic scale precision, the vertical dimensions of the imprinted relief. As outlined above, the curing is preferably a photo-curing, although other curing techniques may be utilized by the process of the present invention.

FIG. 2 shows AFM images of a SWNT applied to a first substrate and corresponding regions of three different PU structures imprinted with a single mold derived from the first substrate or master. Qualitatively, the data shows that the process of the present invention accurately reproduces the nanoscale features associated with the SWNTs, even for multiple imprinting cycles. The Y-shaped SWNT junction, as well as the smaller tube fragments on the first substrate, are all visible in each PU sample. Line scans collected from the lower left branch of the "Y" structure (FIG. 2 insets) show that the imprinted relief features have heights that are similar to those on the master. Some of the apparent distortions in the cross sectional shapes of these features can be attributed to AFM artifacts associated with the roughness on the surface of the molded PU. This roughness has a root mean squared amplitude (evaluated by AFM) of 0.37 nm for Replica 1, and 0.4 nm for Replica 2 and Replica 3. The maximum peak to valley height change associated with this roughness is in the range of ~1.5 nm.

Figure 3A:
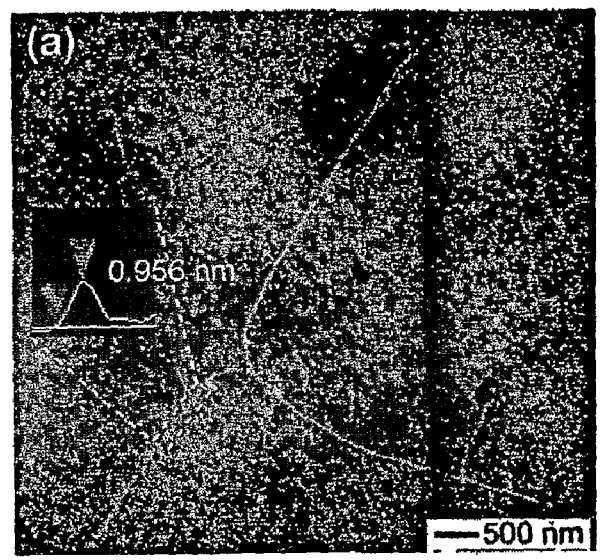
FIG. 3 (*a-c*) includes an atomic force microscopy image of a replica formed by the process of the present invention (a) and two transmission electron microscope images, one of a replica formed by the process of the present invention (b), and a single walled carbon tube of the first substrate (c)
Figure 3B:
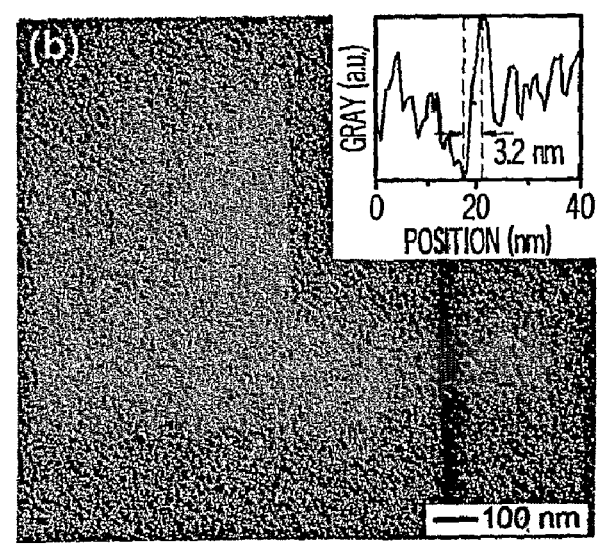
Figure 3C:
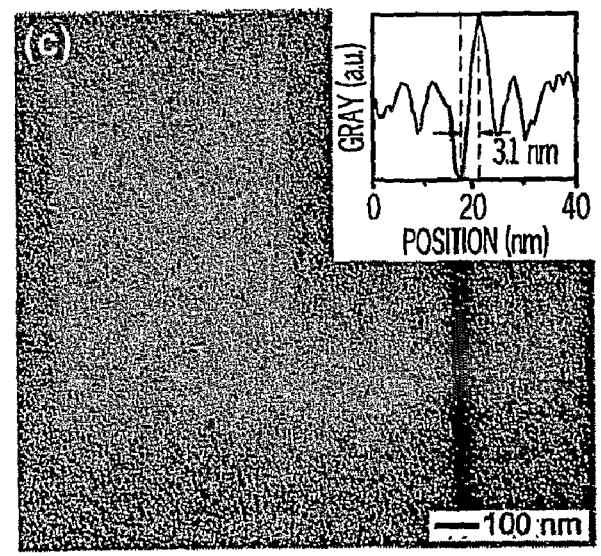
Figure 4A:
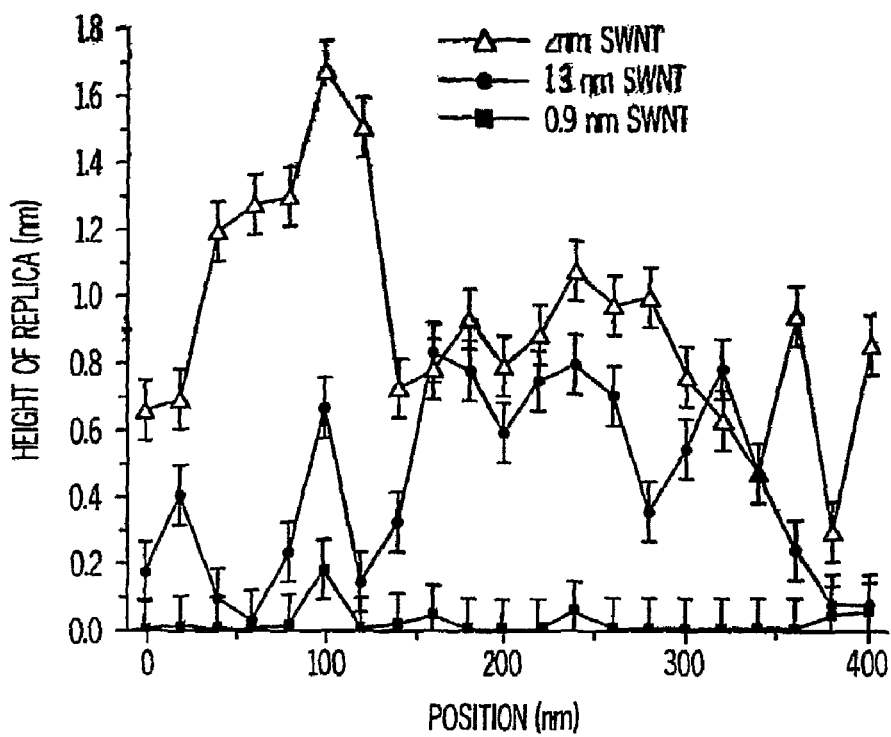
FIG. 4(*a-h*) includes a graph of the heights of features formed in the molding material that are associated with individual carbon nanotubes with diameters of 2, 1.3 and 0.9 nanometers (a), a graph of the length averaged height of features on the replica as a function of the single walled carbon nanotube diameter (b), atomic force microscopy images of individual carbon nanotubes with diameters of 2, 1.3 and 0.9 (c-e), and atomic force microscopy images of replicas associated with individual carbon nanotubes with diameters of 2, 1.3 and 0.9 (f-h).
Figure 4B:
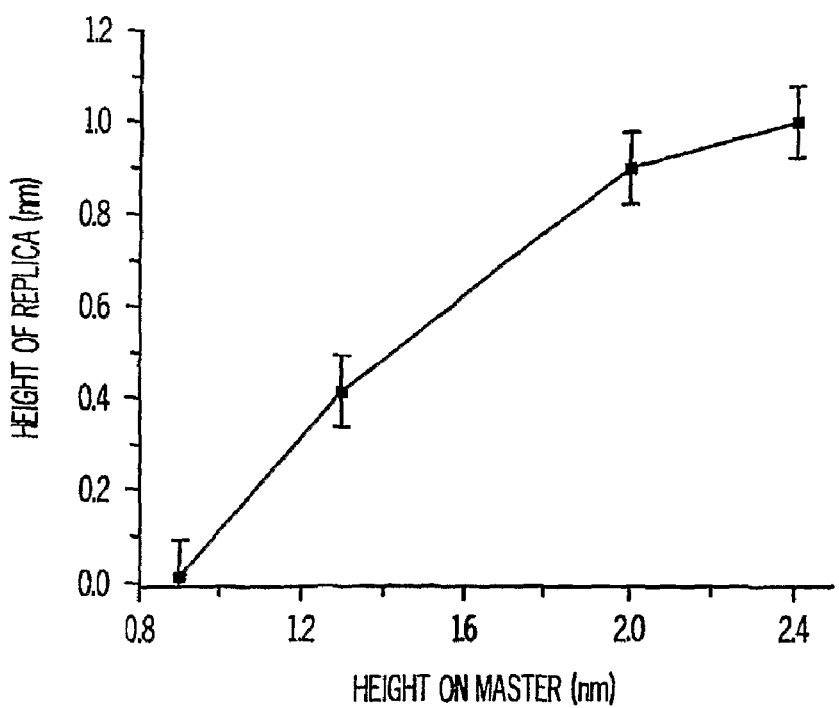
Figure 4C:
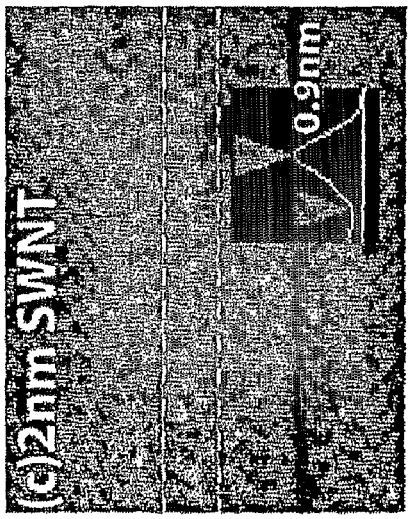
Figure 4D:
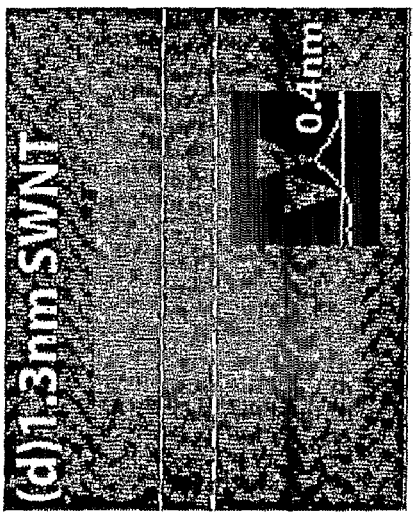
Figure 4E:
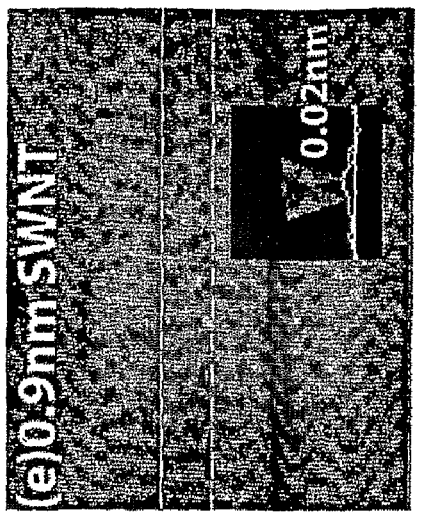
Figure 4F:
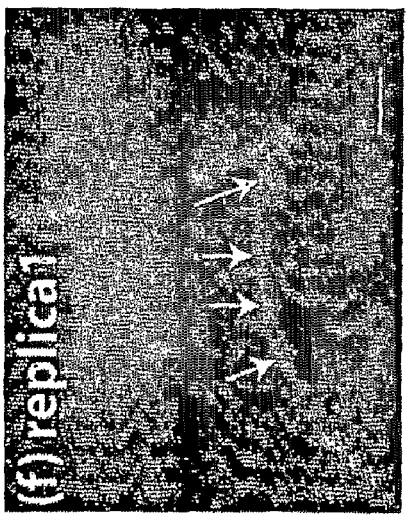
Figure 4G:
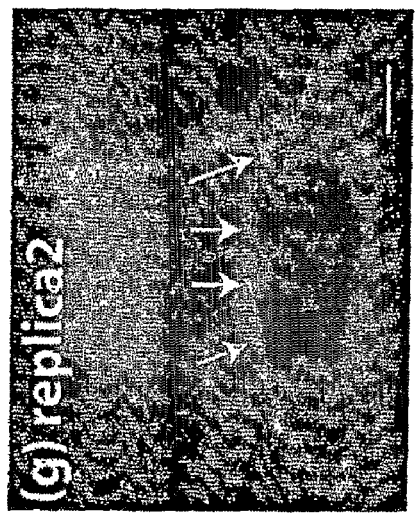
Figure 4H:

Images obtained by AFM only reveal accurately the heights of the relief features. Transmission electron microscopy (TEM) can determine their widths. Polyacrylic acid (PAA), rather than PU, was imprinted for this purpose since PAA is a well-established polymer for TEM analysis. FIG. 3a shows an AFM image of a PAA layer imprinted with the same PDMS mold used for the results of FIG. 2, evaluated in the same region. The replication fidelity, heights of features, surface roughness and other properties are similar to those observed in PU. Depositing (at 30 degrees to the surface of the PAA) Pt/C (to provide contrast in the TEM) and then C (at normal incidence, to provide structural support for the Pt) on the imprinted PAA and then dissolving the PAA with water generates a Pt/C membrane replica of the relief structure. For comparison, a similar Pt/C replica was prepared from a SWNT master by etching away the SiO2 layer (with 2% HF in H2O) to lift off the replica. FIG. 3 shows TEM images of both types of replicas. The dark and bright stripes along the tube features represent regions of metal build-up and shadows, respectively. The separation between the darkest and brightest regions approximately defines the width of the feature. The separation was measured by analyzing lines scans of the images averaged over straight lengths (50 nm) of the relief features of interest. The profiles determined in this way from the imprinted PAA and SWNT masters exhibit similar shapes. In both cases, there was observed a range of widths, between ~3 nm to ~10 nm. Widths below 3 nm were difficult to determine due, at least in part, to the apparent grain size (~1 nm) of the Pt/C. The TEM data of the replicas is consistent with the dimensions and cross sectional shapes of the master.

From the AFM and TEM images presented in FIGS. 2-4, it is clear that SWNTs with diameters larger than 2.5 nm on the master appear reliably as continuous replicated features in the replicas. The heights of these features vary, however, along their lengths from a maximum that is roughly equal to the height of the SWNTs on the master to a minimum that is comparable to this height reduced by a value that is comparable to the peak-to-valley surface roughness. The roughness plays a role in, and is indicative of, the polymer physics that limits the resolution.

The roughness, including line edge roughness and peak to valley roughness contributes to the occurrence of breaks, or apparently missing sections, that begin to appear in AFM images of relief features associated with SWNT diameters <2 nm, as seen in FIG. 4. In a preferred aspect of the present invention, the line edge roughness and surface roughness is less than 2 nanometers. For 1-2 nm diameter SWNTs, these breaks represent a substantial fraction of the overall length of the imprinted structures. Below 1 nm, only small fractions of the replicated structures are visible, as shown in FIG. 4a. However, even at the ~1 nm scale, it is still possible to identify the replicated relief by averaging AFM line cuts collected along the length of a feature, as illustrated in FIG. 4b. The resolution limits can be summarized by plotting the position averaged relief height as a function of SWNT diameter, as illustrated in FIG. 4a-e. The ultimate resolution is correlated to the ability of the prepolymer (PDMS, PU or PAA) to conform to the surface (master or PDMS mold) and the ability of the polymers (PDMS, PU or PAA) to retain the molded shape. Three pieces of data suggest that the PDMS molds limit the resolution. First, breaks, shown in FIGS. 4f-h, in the molded relief features typically occur at the same positions in multiple molding cycles. Second, imprinted structures in dissimilar polymers (i.e. PU and PAA) have similar surface roughness and relief height distributions. Third, PU molded against a bare fluorinated SiO2/Si wafer produces a surface roughness (0.19 nm) that is smaller than that generated with flat PDMS molds derived from these same wafers.

For extremely high resolution features there are at least two important length scales affecting the resolution limits of a replica: (i) the average distance between crosslinks, which is approximately ~1 nm for the h-PDMS, and (ii) the chemical bond lengths, which are in the range of 0.2 nm. A correlation of the above length scales and the resolution limits for features using different PDMS polymers is presented in Table 1. Although it is difficult to assign the observed roughness and resolution limits to particular molecular features of the PDMS, the density of crosslinks is likely to be a critical parameter. The average molecular weight between crosslinks (Mc) and distance between crosslinks (D) were determined by swelling samples in toluene and applying Flory-Huggins theory. Table 1 summarizes the Mc and D values, and experimental resolution limits and roughness parameters for h-PDMS, a low crosslink density version of this material (hl-PDMS) and a commercially available low modulus PDMS (s-PDMS). These three materials exhibit a qualitative correlation between resolution and cross link density. They also show that the resolution and roughness are related; both are influenced by the conformability of the polymer chains and the ability of the crosslinked polymer to retain the molded shape. Attempts to improve the resolution by increasing the number of crosslinks in the h-PDMS failed due to a tendency of the resulting material to stick to the SWNT first substrates.

TABLE 1

|  | Theoretical cross link distance (nm) | Theoretical Mc (g/mol) | Experimental Mc (g/mol) | rms roughness (nm) | Peak to valley roughness (nm) | Approximate Resolution limit |
|---|---|---|---|---|---|---|
| h-PDMS | 1.28 | 357 | 377 | 0.37 | 1.7 | 2 |
| hl-PDMS | 1.6 | 554 | 536 | 0.54 | 3.1 | 3 |
| s-PDMS | 2.7 | 1239 | 891 | 0.54 | 3.2 | 3.5 |

EXAMPLES

The following example procedures were utilized to produce the nano-molded articles analyzed and shown in FIGS. 2-4.

Preparation of carbon nanotube master: A silicon wafer with a 100 nm thick layer of SiO2 (thermally grown) provided a substrate for SWNT growth. Ferritin catalyst (Aldrich) diluted by deionized water at a volumetric ratio of 1:1000 was cast onto the wafer. This wafer was then immediately placed into a quartz tube furnace at 800° C. for 2 min followed by purging with hydrogen gas at 900° C. for 1 min. Flowing methane (500 standard cubic centimeters per minute (sccm)) and hydrogen (75 sccm) through the quartz tube at 900° C. for 10 min grows the SWNT.

Forming Mold: The SWNT/SiO2/Si master was placed in a vacuum chamber along with 100 μL of (tridecafluoro-1,1,2,2-tetrahydrooctyl)-1-trichlorosilane (United Chemical Tech) for 2 hr. The resulting silane layer (monolayer or submonolayer coverage is expected) prevents adhesion of the PDMS to the bare SiO2. h-PDMS (Gelest, Inc) was prepared as following: 3.4 g (7-8% vinylmethylsiloxane) (Dimethylsiloxane), 100 μg of (1,3,5,7-tetravinyl-1,3,5,7-tetramethylcyclotetrasiloxane) and 50 μg of platinum catalyst were mixed and placed in vacuum chamber for 5 min. 1 g (25-30% methylhydrosiloxane) (Dimethylsiloxane) was then added, mixed and then the resulting sample was placed back into vacuum for 5 min. This prepolymer mixture was spin cast onto the SWNT master at 1000 rpm for 40 s and then baked at 65° C. for 4 min. s-PDMS (Sylgard 184, Dow Corning), prepared by mixing base and curing agent at a ratio of 10:1 was then poured onto the h-PDMS. Baking at 65° C. for 2 hr completed the curing of the polymers. Typical thicknesses were 10 μm for the h-PDMS and 3 mm for the s-PDMS.

Molding material: The polyurethane (PU) (NOA 73, Norland Products) was spin cast onto a SiO2/Si wafer at 9000 rpm for 40 s. The mold was placed onto this thin film and pressed gently to ensure good wetting at the interface. Exposing the PU to ultraviolet light (350-380 nm; long wave ultraviolet lamp, UVP) at about 19 mw/cm2 for 1 hr through the mold cured the PU and solidified the film.

Measurement analysis: Characterization of the SWNT master and imprinted PU structure was carried out by AFM (Dimension 3100, Digital Instrument) and TEM (Philips CM200, FEI). The TEM pictures of the metal shadowed replicas were taken at 120 kV. The AFM measurements were executed in tapping mode with tips (BS-Tap300Al) from BudgetSensors. The resonant frequency of the tip was 300 kHz.

Preparation of TEM sample: Several drops of a methanol solution of polyacrylic acid (PAA) (30% wt) were placed onto a PDMS mold. The sample was left in this configuration, in open air, until the methanol evaporated (~10 hours was typically sufficient). The PAA film was then peeled away leaving an imprinted nanostructure on the surface of the PAA. The sample was placed in the vacuum chamber of a thermal evaporator. The Pt/C source was located above the sample at an elevation angle of 30 degree. A few nanometers of Pt/C were deposited on the sample. Subsequently, carbon film with thickness of ~10 nm was evaporated at normal incidence on the sample. The sample was soaked in DI water for several hours until PAA was dissolved. The Pt/C and carbon film was then floated on the water surface. They were later collected by a TEM copper mesh.

The invention has been described in an illustrative manner, and it is to be understood that the terminology that has been used is intended to be in a nature of description rather than limitation.

Many modifications and variations of the present invention are possible in light of the above teachings. It is therefore, to be understood that within the scope of the appended claims, the invention may be practiced other than as specifically described.

The invention claimed is:

1. A nano-molding process comprising:
   forming a first substrate having nano-scale features formed thereon, wherein the nano-scale features have lateral and vertical dimensions of less than ten nanometers;
   forming a mold against the first substrate;
   removing the mold from the first substrate;
   providing a second substrate having a molding material applied thereon;
   pressing the mold against the second substrate allowing the molding material to conform to a shape of the mold;
   curing the molding material; and
   removing the mold from the second substrate having the cured molding material revealing a replica of the first substrate.

2. The nano-molding process of claim 1, wherein forming the mold further comprises:
   casting a first polymer against the first substrate;
   partially curing the first polymer;
   applying a second polymer to the first polymer; and
   curing the first and second polymer to form the mold.

3. The nano-molding process of claim 2 wherein the first polymer comprises h-polydimethylsiloxane.

4. The nano-molding process of claim 2 wherein the second polymer comprises s-polydimethylsiloxane.

5. The nano-molding process of claim 1 wherein the first substrate has nano-scale features having dimensions greater than 2 nanometers.

6. The nano-molding process of claim 5 wherein the dimensions are from 2 to 7 nanometers.

7. The nano-molding process of claim 1 wherein the step of forming the first substrate includes forming single walled carbon nanotubes on a silicon wafer.

8. The nano-molding process of claim 1 wherein the molding material comprises a photo curable material.

9. The nano-molding process of claim 8 wherein the photocurable material is selected from the group consisting of: polyurethanes or vinyl-functional monomers.

10. The nano-molding process of claim 1 further comprising: verifying the dimensions of the replica.

11. The nano-molding process of claim 10 wherein verifying comprises:
   measuring a vertical dimension on the first substrate;
   measuring a vertical dimension on the replica; and
   comparing the vertical measurements of the first substrate and replica.

12. The nano-molding process of claim 11 wherein the vertical dimension is measured using atomic force microscopy.

13. The nano-molding process of claim 10 wherein verifying comprises:
   measuring a lateral dimension on the first substrate;
   measuring a lateral dimension on the replica; and
   comparing the lateral measurements of the first substrate and replica.

14. The nano-molding process of claim 13 wherein the lateral dimension is measured using transmission electron microscopy.

15. The nano-molding process of claim 1, wherein the replica has a line-edge roughness less than 2 nanometers.

16. The nano-molding process of claim 1, wherein the nano-scale features of the first substrate have a minimal lateral dimension of less than 7 nanometers.

17. The nano-molding process of claim 1, wherein an inherent surface roughness as measured by the peak-to-valley surface roughness of the material is less than 2 nanometers.

* * * * *